(12) United States Patent
Tsai et al.

(10) Patent No.: US 9,972,564 B2
(45) Date of Patent: May 15, 2018

(54) LAYER STRUCTURE FOR MOUNTING SEMICONDUCTOR DEVICE AND FABRICATION METHOD THEREOF

(71) Applicant: Siliconware Precision Industries Co., Ltd., Taichung (TW)

(72) Inventors: Fang-Lin Tsai, Taichung (TW); Yi-Feng Chang, Taichung (TW); Cheng-Jen Liu, Taichung (TW); Yi-Min Fu, Taichung (TW); Hung-Chi Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 123 days.

(21) Appl. No.: 14/290,217

(22) Filed: May 29, 2014

(65) Prior Publication Data

US 2015/0206814 A1    Jul. 23, 2015

(30) Foreign Application Priority Data

Jan. 17, 2014    (TW) .............................. 103101747 A

(51) Int. Cl.
| | |
|---|---|
| H01L 23/498 | (2006.01) |
| H01L 29/78 | (2006.01) |
| H01L 21/265 | (2006.01) |
| H01L 29/762 | (2006.01) |
| H01L 21/48 | (2006.01) |

(52) U.S. Cl.
CPC .. *H01L 23/49827* (2013.01); *H01L 21/26533* (2013.01); *H01L 21/486* (2013.01); *H01L 29/762* (2013.01); *H01L 29/7834* (2013.01); *H01L 2224/16225* (2013.01); *H01L 2924/0002* (2013.01)

(58) Field of Classification Search
CPC . H01L 23/49827; H01L 23/14; H01L 21/486; H05K 1/0298
See application file for complete search history.

(56) References Cited

U.S. PATENT DOCUMENTS

| | | | | |
|---|---|---|---|---|
| 6,573,148 | B1 * | 6/2003 | Bothra | ................ H01F 17/0013 257/E21.022 |
| 2011/0248380 | A1 * | 10/2011 | Yoshihara | ............... H01F 5/003 257/531 |

(Continued)

*Primary Examiner* — Amar Movva

(74) *Attorney, Agent, or Firm* — Mintz Levin Cohn Ferris Glovsky and Popeo, P.C.; Peter F. Corless; Steven M. Jensen

(57) ABSTRACT

A fabrication method of a layer structure for mounting a semiconductor device is provided, which includes the steps of: providing a base material, wherein the base material has a conductive layer having a first surface having a plurality of first conductive elements and an opposite second surface having a plurality of second conductive elements, and a first encapsulant formed on the first surface of the conductive layer for encapsulating the first conductive elements; partially removing the conductive layer to form a circuit layer that electrically connects the first conductive elements and the second conductive elements; and forming a second encapsulant on a bottom surface of the first encapsulant for encapsulating the circuit layer and the second conductive elements, thus reducing the fabrication difficulty and increasing the product yield.

7 Claims, 4 Drawing Sheets

(56) References Cited

U.S. PATENT DOCUMENTS

2011/0278717 A1* 11/2011 Pagaila ................ H01L 21/568
                                                                               257/737
2012/0074580 A1* 3/2012 Nalla ................... H01L 21/568
                                                                               257/774

* cited by examiner

LAYER STRUCTURE FOR MOUNTING SEMICONDUCTOR DEVICE AND FABRICATION METHOD THEREOF

CROSS-REFERENCES TO RELATED APPLICATIONS

This application claims under 35 U.S.C. § 119(a) the benefit of Taiwanese Application No. 103101747, filed Jan. 17, 2014, the entire contents of which is incorporated herein by reference.

BACKGROUND OF THE INVENTION

1. Field of the Invention

The present invention relates to layer structures for mounting semiconductor devices and fabrication methods thereof, and more particularly, to a layer structure for mounting a semiconductor device and a fabrication method thereof so as to improve the product yield.

2. Description of Related Art

Currently, to achieve small-size and low-cost semiconductor products, a copper layer is formed on a carrier and an insulating layer is formed on the carrier to encapsulate the copper layer, and then the carrier is removed by etching so as to form a thin layer structure.

FIGS. 1A to 1D are schematic cross-sectional views showing a layer structure for mounting a semiconductor device and a fabrication method thereof according to the prior art.

Referring to FIG. 1A, a first copper layer 11 is formed on a carrier 10 by electroplating.

Referring to FIG. 1B, a second copper layer 12 is formed on the first copper layer 11 by electroplating.

Referring to FIG. 1C, an insulating layer 13 is formed on the carrier 10 to encapsulate the first copper layer 11 and the second copper layer 12, and a top surface 121 of the second copper layer 12 is exposed from the insulating layer 13.

Referring to FIG. 1D, the carrier 10 is removed by etching to expose a bottom surface 111 of the first copper layer 11, thereby forming a layer structure 1 for mounting a semiconductor device.

However, during the etching process, the etching depth is difficult to control. Further, the first copper layer 11 and the second copper layer 12 generally have a small thickness so as for the layer structure 1 to be light and thin. As such, when the carrier 10 is removed by etching, the first copper layer 11 and the second copper layer 12 are easily damaged, thereby reducing the product yield.

Therefore, there is a need to provide a layer structure for mounting a semiconductor device and a fabrication method thereof so as to overcome the above-described drawbacks.

SUMMARY OF THE INVENTION

In view of the above-described drawbacks, the present invention provides a layer structure for mounting a semiconductor device, which comprises: a first encapsulant having a first bottom surface and a first top surface opposite to the first bottom surface; a plurality of first conductive elements embedded in the first encapsulant and each having a first end portion exposed from the first bottom surface of the first encapsulant; a circuit layer formed on the first end portions of the first conductive elements and having a first surface adjacent to the first conductive elements and a second surface opposite to the first surface; a plurality of second conductive elements formed on the second surface of the circuit layer so as to be electrically connected to the first conductive elements through the circuit layer; and a second encapsulant formed on the first bottom surface of the first encapsulant for encapsulating the circuit layer and the second conductive elements, wherein the second encapsulant has a second top surface adjacent to the first encapsulant and a second bottom surface opposite to the second top surface.

Each of the first conductive elements can have a second end portion exposed from the first top surface of the first encapsulant, and each of the second conductive elements can have a third end portion exposed from the second bottom surface of the second encapsulant.

The layer structure can further comprise a chip mounted on the second bottom surface of the second encapsulant and electrically connected to the third end portions of the second conductive elements.

The layer structure can further comprise a chip and/or a circuit board. The chip can be mounted on the first top surface of the first encapsulant and electrically connected to the second end portions of the first conductive elements, and the circuit board can be mounted on the second bottom surface of the second encapsulant and electrically connected to the third end portions of the second conductive elements.

The circuit layer can have a thickness less than 300 um. The circuit layer can be made of gold, copper, iron, steel or copper-nickel-palladium alloy.

The present invention further provides a fabrication method of a layer structure for mounting a semiconductor device, which comprises the steps of: providing a base material, wherein the base material comprises: a conductive layer having a first surface having a plurality of first conductive elements formed thereon and a second surface opposite to the first surface and having a plurality of second conductive elements formed thereon, and a first encapsulant formed on the first surface of the conductive layer for encapsulating the first conductive elements and having a first bottom surface adjacent to the conductive layer and a first top surface opposite to the first bottom surface; partially removing the conductive layer to form a circuit layer that electrically connects the first conductive elements and the second conductive elements; and forming a second encapsulant on the first bottom surface of the first encapsulant for encapsulating the circuit layer and the second conductive elements, wherein the second encapsulant has a second top surface adjacent to the first encapsulant and a second bottom surface opposite to the second top surface.

In the above-described method, fabrication of the base material can comprise: forming the first conductive elements on the first surface of the conductive layer; forming the first encapsulant on the first surface of the conductive layer for encapsulating the first conductive elements; and forming the second conductive elements on the second surface of the conductive layer.

The method can further comprise thinning the first encapsulant from the first top surface to expose second end portions of the first conductive elements, and thinning the second encapsulant from the second bottom surface to expose third end portions of the second conductive elements.

The method can further comprise mounting a chip on the second bottom surface of the second encapsulant and electrically connecting the chip and the third end portions of the second conductive elements.

The method can further comprise: mounting a chip on the first top surface of the first encapsulant and electrically connecting the chip and the second end portions of the first conductive elements, and mounting a circuit board on the second bottom surface of the second encapsulant and electrically connecting the circuit board and the third end portions of the second conductive elements.

The conductive layer can be a conductive film and have a thickness less than 300 um. The conductive layer can be made of gold, copper, iron, steel or copper-nickel-palladium alloy.

The present invention mainly comprises forming a plurality of first and second conductive elements on first and second surfaces of a conductive layer, respectively, and forming a first encapsulant to encapsulate the first conductive elements and forming a second encapsulant to encapsulate the second conductive elements and a circuit layer formed from the conductive layer.

Therefore, the present invention overcomes the conventional problem that the first and second copper layers are easily damaged during etching of the carrier. According to the present invention, the first and second conductive elements can be easily formed on the conductive layer so as to reduce the fabrication difficulty and increase the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "top", "bottom", "on", "a" etc. are merely for illustrative purposes and should not be construed to limit the scope of the present invention.

FIGS. 2A to 2G are schematic cross-sectional views showing a layer structure for mounting a semiconductor device and a fabrication method thereof according to the present invention.

Figure 1A:
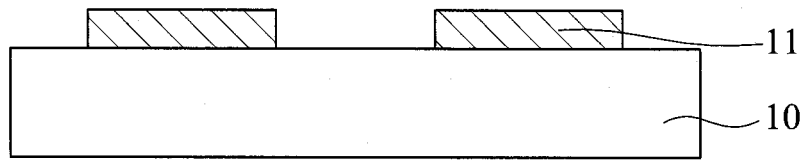
FIGS. 1A to 1D are schematic cross-sectional views showing a layer structure for mounting a semiconductor device and a fabrication method thereof according to the prior art.
Figure 1B:
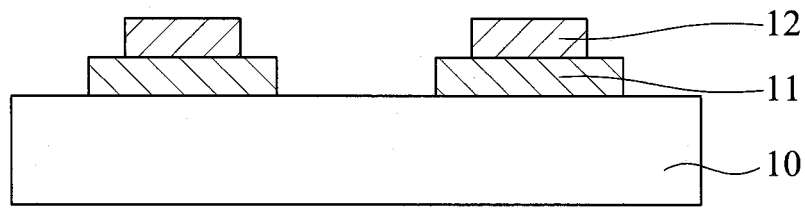
Figure 1C:
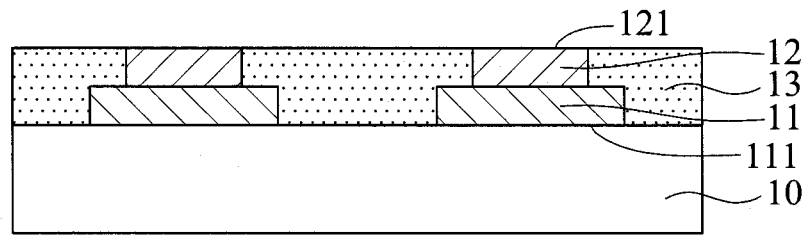
Figure 1D:
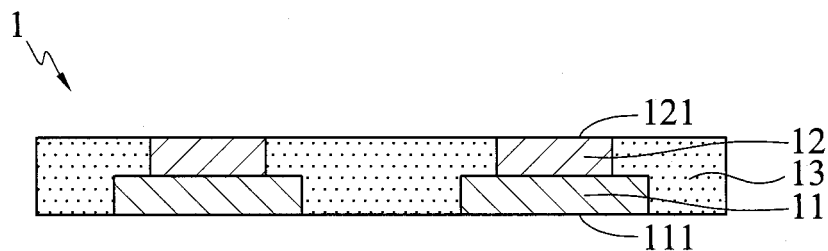
Figure 2A:
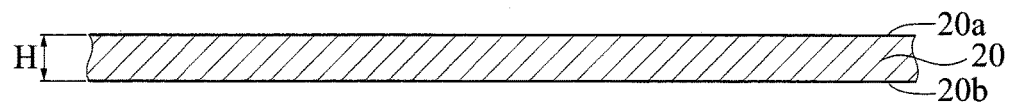
FIGS. 2A to 2G are schematic cross-sectional views showing a layer structure for mounting a semiconductor device and a fabrication method thereof according to the present invention.

Referring to FIG. 2A, a conductive layer 20 having a first surface 20a and a second surface 20b opposite to the first surface 20a is provided. The conductive layer 20 can be a conductive film and have a thickness H less than 300 um. The conductive layer 20 can be made of, but not limited to, gold, copper, iron, steel, cold-pressed steel or copper-nickel-palladium alloy.

Figure 2B:
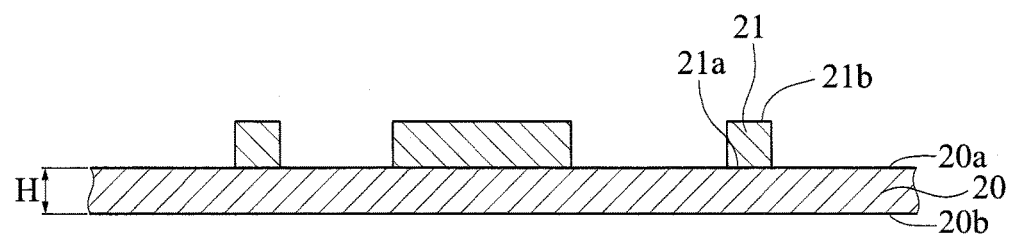

Referring to FIG. 2B, a plurality of first conductive elements 21 are formed on the first surface 20a of the conductive layer 20. Each of the first conductive elements 21 has a first end portion 21a adjacent to the conductive layer 20 and a second end portion 21b opposite to the first end portion 21a.

Figure 2C:
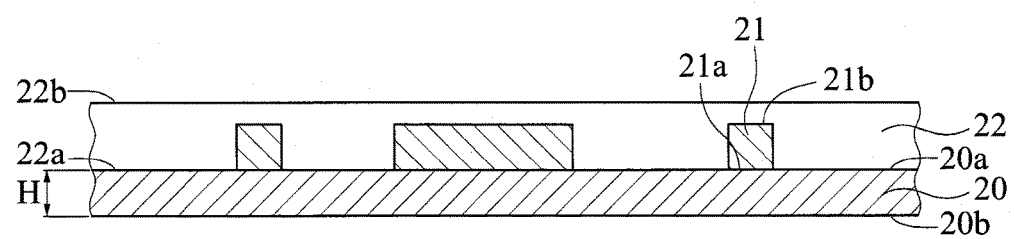

Referring to FIG. 2C, a first encapsulant 22 is formed on the first surface 20a of the conductive layer 20 for encapsulating the first conductive elements 21. The first encapsulant 22 has a first bottom surface 22a adjacent to the conductive layer 20 and a first top surface 22b opposite to the first bottom surface 22a.

Figure 2D:
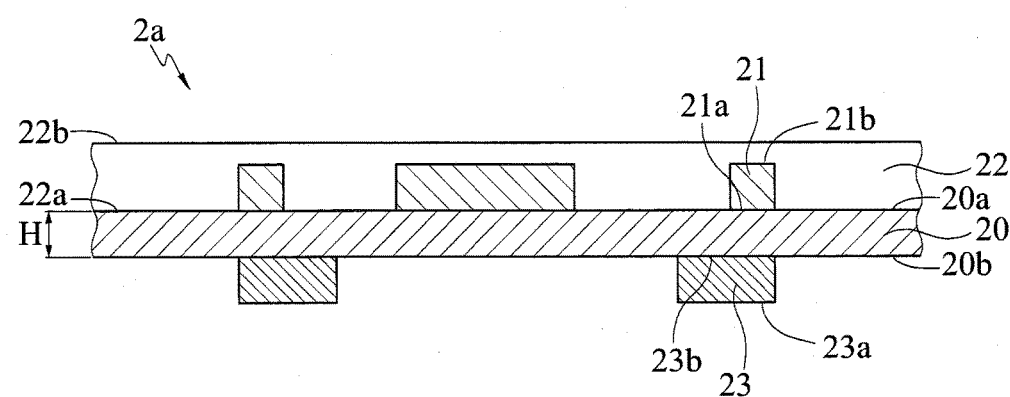

Referring to FIG. 2D, a plurality of second conductive elements 23 are formed on the second surface 20b of the conductive layer 20. Each of the second conductive elements 23 has a third end portion 23a and a fourth end portion 23b opposite to the third end portion 23a and adjacent to the conductive layer 20. As such, the conductive layer 20, the first conductive elements 21, the first encapsulant 22 and the second conductive elements 23 constitute a base material 2a.

Figure 2E:
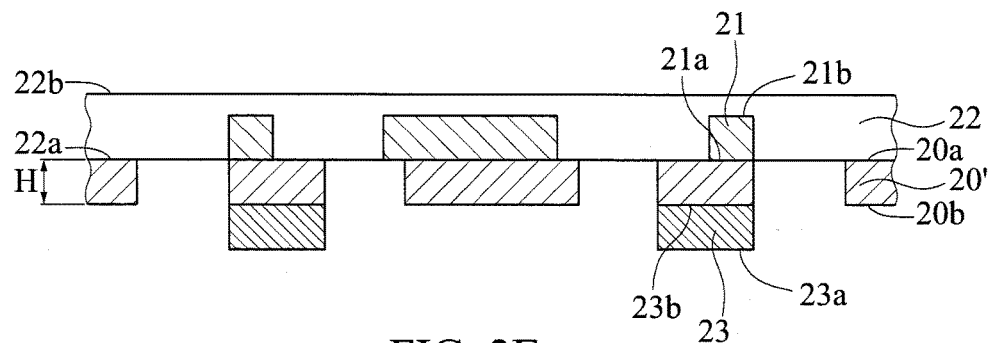

Referring to FIG. 2E, the conductive layer 20 is patterned or partially removed by etching to form a circuit layer 20' that electrically connects the first conductive elements 21 and the second conductive elements 23.

Figure 2F:
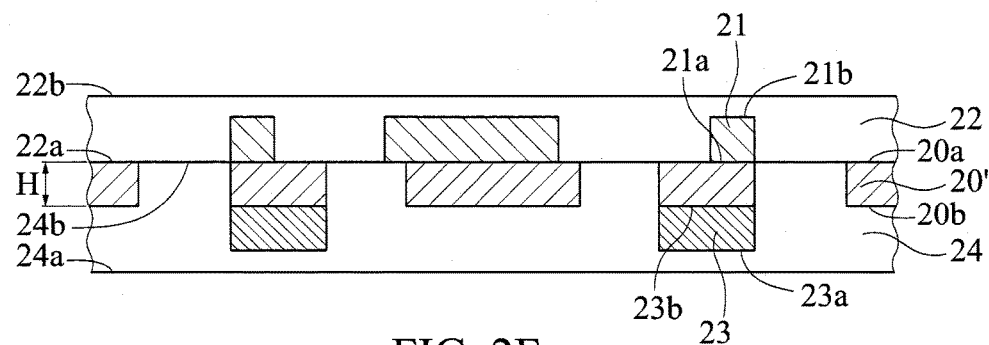

Referring to FIG. 2F, a second encapsulant 24 is formed on the first bottom surface 22a of the first encapsulant 22 for encapsulating the circuit layer 20' and the second conductive elements 23. The second encapsulant 24 has a second top surface 24b adjacent to the first encapsulant 22 and a second bottom surface 24a opposite to the second top surface 24b.

Figure 2G:
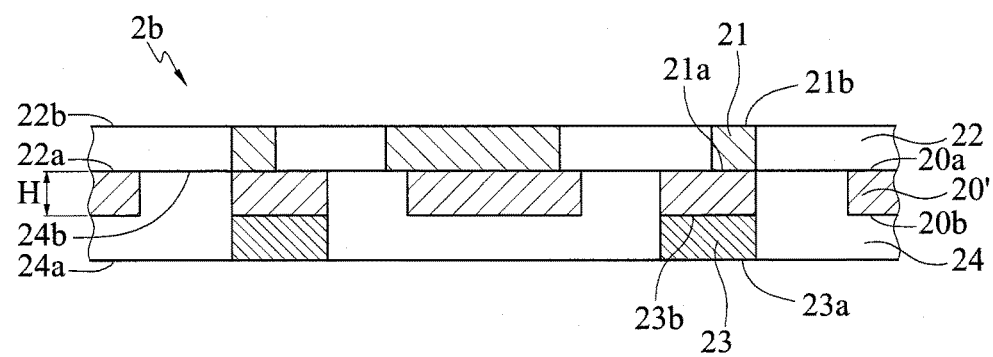

Referring to FIG. 2G. The first encapsulant 22 is thinned from the first top surface 22b by such as grinding so as to expose the second end portions 21b of the first conductive elements 21. Further, the second encapsulant 24 can be thinned from the second bottom surface 24a so as to expose the third end portions 23a of the second conductive elements 23. As such, a layer structure 2b for mounting a semiconductor device is formed.

The present invention further provides a layer structure 2b for mounting a semiconductor device. Referring to FIG. 2G, the layer structure 2b has: a first encapsulant 22 having a first bottom surface 22a and a first top surface 22b opposite to the first bottom surface 22a; a plurality of first conductive elements 21 embedded in the first encapsulant 22 and each having a first end portion 21a exposed from the first bottom surface 22a of the first encapsulant 22; a circuit layer 20' formed on the first end portions 21a of the first conductive elements 21 and having a first surface 20a adjacent to the first conductive elements 21 and a second surface 20b opposite to the first surface 20a; a plurality of second conductive elements 23 formed on the second surface 20b of the circuit layer 20' so as to be electrically connected to the first conductive elements 21 through the circuit layer 20'; and a second encapsulant 24 formed on the first bottom surface 22a of the first encapsulant 22 for encapsulating the circuit layer 20' and the second conductive elements 23, wherein the second encapsulant 24 has a second top surface 24b adjacent to the first encapsulant 22 and a second bottom surface 24a opposite to the second top surface 24b.

Further, each of the first conductive elements 21 can have a second end portion 21b exposed from the first top surface 22b of the first encapsulant 22.

The circuit layer 20' can further be formed on a portion of the first bottom surface 22a of the first encapsulant 22. The circuit layer 20' can have a thickness less than 300 um. The circuit layer 20' can be made of gold, copper, iron, steel, cold-pressed steel or copper-nickel-palladium alloy.

Further, each of the second conductive elements 23 can have a third end portion 23a exposed from the second bottom surface 24a of the second encapsulant 24.

Figure 3:
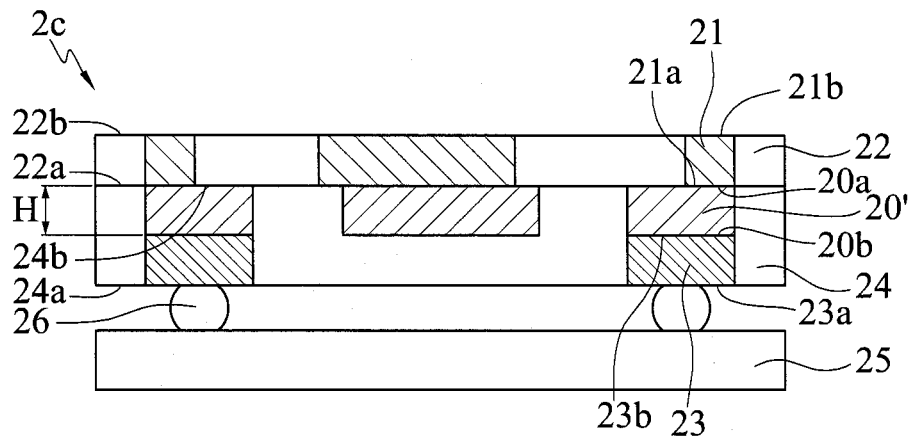
FIGS. 3 and 4 are schematic cross-sectional views showing other embodiments of the layer structure of the present invention.
Figure 4:
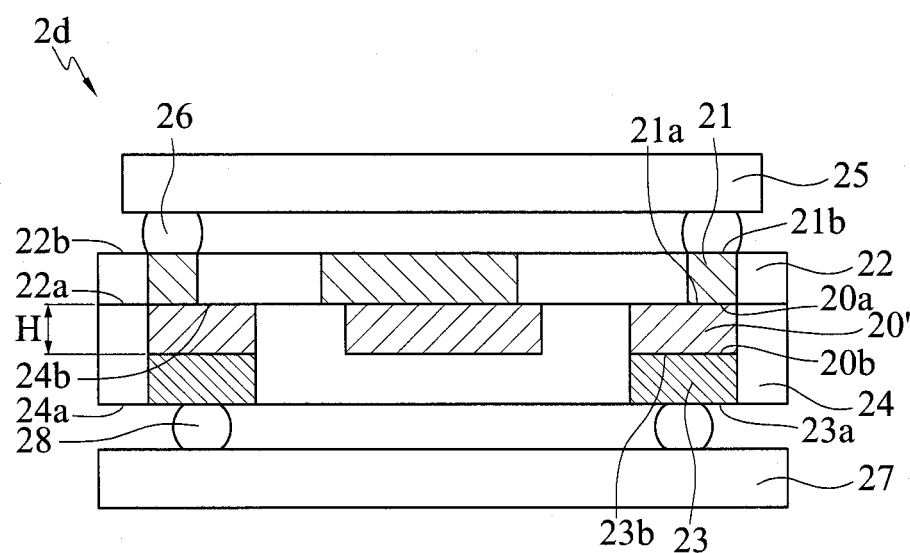

FIGS. 3 and 4 are schematic cross-sectional views showing other embodiments of the layer structure of the present invention.

Referring to FIG. 3, a singulation process is performed to the layer structure 2b of FIG. 2G and then a chip 25 is mounted on the second bottom surface 24a of the second encapsulant 24 and electrically connected to the third end portions 23a of the second conductive elements 23 through a plurality of first solder balls 26, thereby forming a layer structure 2c for mounting a semiconductor device.

In other words, the layer structure 2c of FIG. 3 can have a chip 25 mounted on the second bottom surface 24a of the second encapsulant 24 and electrically connected to the third end portions 23a of the second conductive elements 23 through a plurality of first solder balls 26.

In another embodiment, referring to FIG. 4, a singulation process is performed to the layer structure 2b of FIG. 2G. Then, a chip 25 can be mounted on the first top surface 22b of the first encapsulant 22 and electrically connected to the second end portions 21b of the first conductive elements 21 through a plurality of first solder balls 26, and/or a circuit board 27 can be mounted on the second bottom surface 24a of the second encapsulant 24 and electrically connected to the third end portions 23a of the second conductive elements 23 through a plurality of second solder balls 28. As such, a layer structure 2d for mounting a semiconductor device is formed.

In other words, the layer structure 2d of FIG. 4 can have a chip 25 and/or a circuit board 27. The chip 25 can be mounted on the first top surface 22b of the first encapsulant 22 and electrically connected to the second end portions 21b of the first conductive elements 21. The circuit board 27 can be mounted on the second bottom surface 24a of the second encapsulant 24 and electrically connected to the third end portions 23a of the second conductive elements 23.

The present invention mainly involves forming a plurality of first and second conductive elements on first and second surfaces of a conductive layer, respectively, and forming a first encapsulant to encapsulate the first conductive elements and forming a second encapsulant to encapsulate the second conductive elements and a circuit layer formed from the conductive layer.

Therefore, the present invention overcomes the conventional problem that the first and second copper layers are easily damaged during etching of the carrier. According to the present invention, the first and second conductive elements can be easily formed on the conductive layer so as to reduce the fabrication difficulty and increase the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A layer structure for mounting a semiconductor device, comprising:
   a single layer of first encapsulant having a first bottom surface and a first top surface opposite to the first bottom surface;
   a plurality of first conductive elements embedded in the single layer of first encapsulant and each having a first end portion exposed from the first bottom surface of the single layer of first encapsulant and a second end portion exposed from the first top surface of the single layer of first encapsulant;
   a circuit layer formed on the first end portions of the first conductive elements and having a first surface adjacent to the first conductive elements and a second surface opposite to the first surface;
   a plurality of second conductive elements formed on the second surface of the circuit layer so as to be electrically connected to the first conductive elements through the circuit layer; and
   a single layer of second encapsulant formed on the first bottom surface of the single layer of first encapsulant for encapsulating the circuit layer and the second conductive elements, wherein the single layer of second encapsulant has a second top surface adjacent to the single layer of first encapsulant and a second bottom surface opposite to the second top surface, and wherein the first top surface of the single layer of first encapsulant and the second bottom surface of the single layer of second encapsulant respectively form an outer surface and another outer surface of the layer structure.

2. The structure of claim 1, wherein each of the second conductive elements has a third end portion exposed from the second bottom surface of the single layer of second encapsulant.

3. The structure of claim 2, further comprising a chip mounted on the second bottom surface of the single layer of second encapsulant and electrically connected to the third end portions of the second conductive elements.

4. The structure of claim 2, further comprising a chip mounted on the first top surface of the single layer of first encapsulant and electrically connected to the second end portions of the first conductive elements.

5. The structure of claim 4, further comprising a circuit board mounted on the second bottom surface of the single layer of second encapsulant and electrically connected to the third end portions of the second conductive elements.

6. The structure of claim 1, wherein the circuit layer has a thickness less than 300 um.

7. The structure of claim 1, wherein the circuit layer is made of gold, copper, iron, steel or copper-nickel-palladium alloy.

* * * * *